United States Patent [19]

Yokokura

[11] Patent Number: 5,444,659
[45] Date of Patent: Aug. 22, 1995

[54] SEMICONDUCTOR MEMORY DEVICE HAVING MEANS FOR MONITORING BIAS VOLTAGE

[75] Inventor: Seiichiro Yokokura, Tokyo, Japan

[73] Assignee: Kabushiki Kaisha Toshiba, Kawasaki, Japan

[21] Appl. No.: 288,221

[22] Filed: Aug. 9, 1994

Related U.S. Application Data

[63] Continuation of Ser. No. 755,789, Sep. 6, 1991, abandoned.

[30] Foreign Application Priority Data

Sep. 11, 1990 [JP] Japan .................. 2-238884

[51] Int. Cl.6 .................. G11C 11/40; G11C 7/00
[52] U.S. Cl. .................. 365/189.09; 365/201; 365/226
[58] Field of Search .................. 365/189.09, 189.06, 365/189.11, 189.07, 201, 185, 226

[56] References Cited

U.S. PATENT DOCUMENTS

| | | | |
|---|---|---|---|
| 4,418,403 | 11/1983 | O'Toole et al. | 365/201 |
| 4,584,663 | 4/1986 | Tanikawa | 365/201 X |
| 4,587,640 | 5/1986 | Saitoh | 365/226 X |
| 4,636,983 | 1/1987 | Young et al. | 365/189.09 |
| 4,720,818 | 1/1988 | Takeguchi | 365/201 |
| 4,839,865 | 6/1989 | Sato et al. | 365/201 |
| 4,839,865 | 6/1989 | Sato et al. | 365/201 |
| 4,982,364 | 1/1991 | Iwahashi | 364/189.09 |
| 5,046,052 | 9/1991 | Miyaji et al. | 365/226 |

FOREIGN PATENT DOCUMENTS

| | | |
|---|---|---|
| 0206695A2 | 12/1986 | European Pat. Off. . |
| 3637682A1 | 5/1987 | Germany . |
| WO83/04109 | 11/1983 | WIPO . |

Primary Examiner—Joseph A. Popek
Attorney, Agent, or Firm—Finnegan, Henderson, Farabow, Garrett & Dunner

[57] ABSTRACT

A semiconductor memory device having a power supply terminal, a circuit ground, a plurality of memory cells for storing data, bias voltage generating means connected between the power supply terminal and circuit ground, for applying a bias voltage to the memory cells, and monitor means for monitoring the bias voltage.

10 Claims, 3 Drawing Sheets

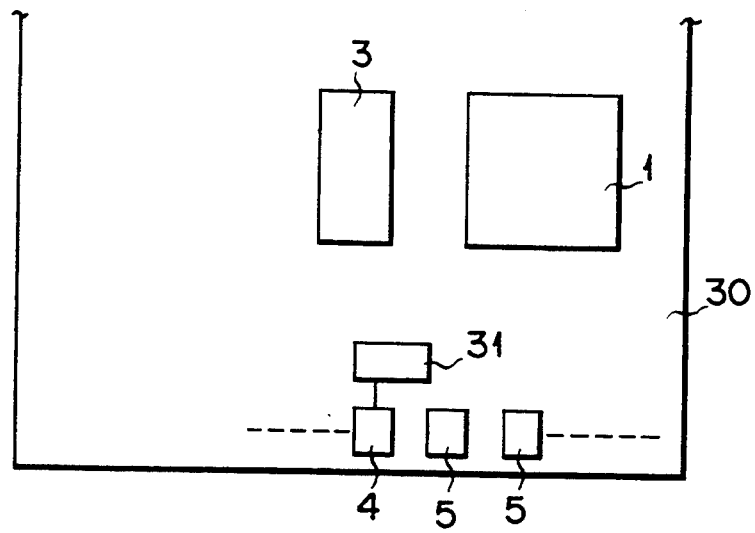
F I G. 3
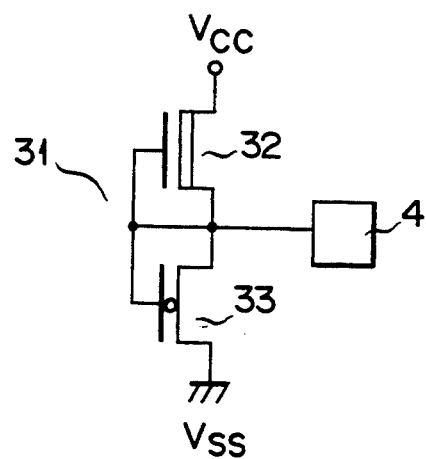
F I G. 4

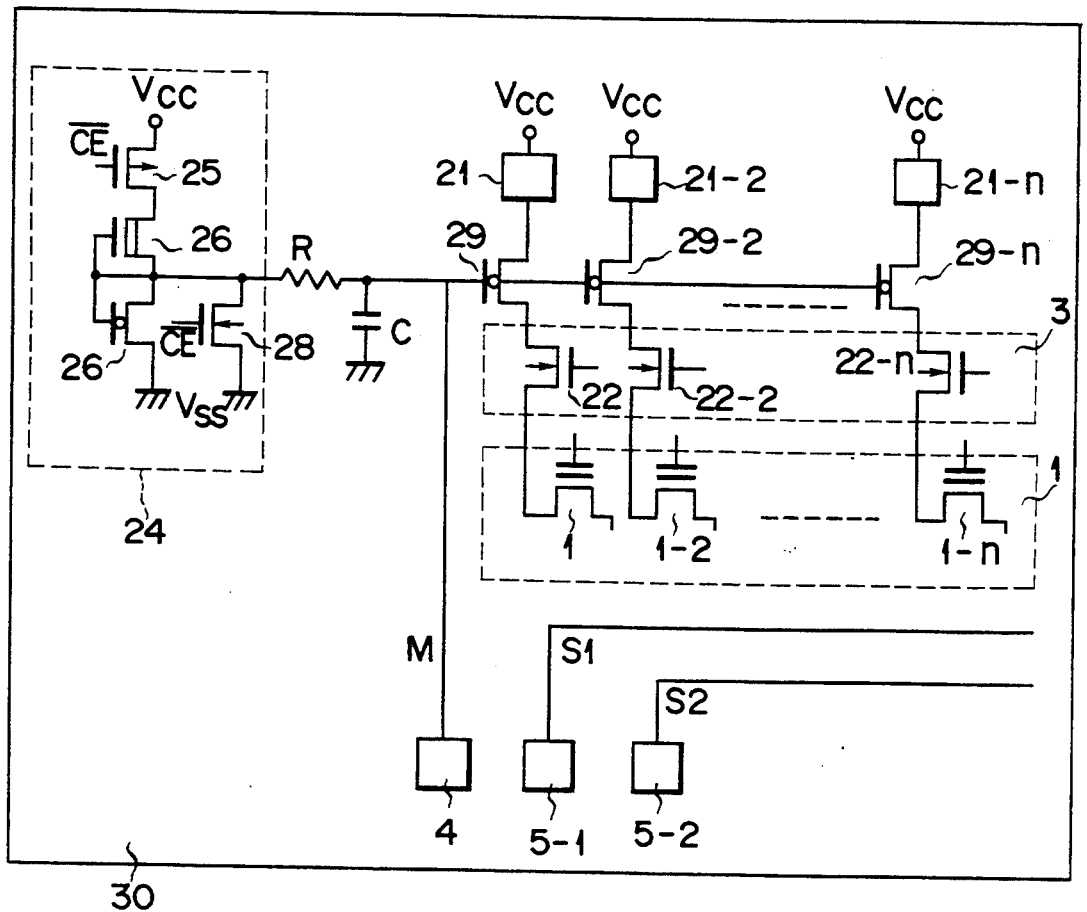
F I G. 5
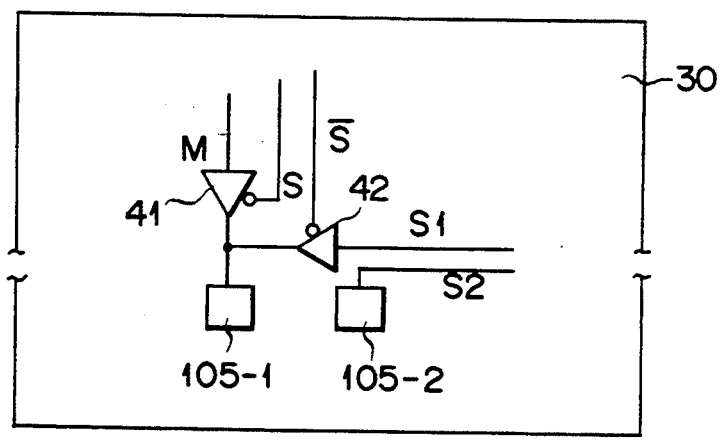
F I G. 6

SEMICONDUCTOR MEMORY DEVICE HAVING MEANS FOR MONITORING BIAS VOLTAGE

This application is a continuation of application Ser. No. 07/755,789 Sep. 6, 1991, now abandoned.

BACKGROUND OF THE INVENTION

1. Field of the Invention

This invention relates to a semiconductor memory device having floating gate avalanche MOS FETs.

2. Description of the Related Art

Floating gate avalanche MOS FETs and the like are used as memory cells in a non-volatile semiconductor memory such as an Erasable Programmable Read-Only Memory (EPROM) or an Electrically Erasable Programmable Read Only Memory (EEPROM). These memory devices incorporate bias voltage supply circuits for supplying a bias voltage to memory cells.

The bias voltage may be unstable in some memory devices which are not formed according to the present invention. However, if an inferior device is detected by measuring bias voltages in devices after they have been produced, it cannot be eliminated from the other.

SUMMARY OF THE INVENTION

It is the object of the other devices invention to detect, in the production stage, an abnormality in a bit line voltage clamp circuit employed in a memory device using floating gate FETs.

This invention provides a semiconductor memory device comprising a power supply terminal (Vcc); a circuit ground (Vss); a plurality of memory cells (1-1 . . . 1-n) for storing data; bias voltage generating means (24) connected between the power supply terminal (Vcc) and circuit ground (Vss), for applying a bias voltage to the memory cells (1-1 . . . 1-n); and monitor means (4) for monitoring the bias voltage.

An abnormality in the bias voltage in a memory device chip, if one exists, can be detected by monitoring the chip by means of the monitor means (4) incorporated therein before the chip is put on the market. Thus, inferior chips can be eliminated. Moreover, in a case where floating gate FETs are used in the bias voltage generating circuit, an abnormality in a floating gate FET, if one exists, can be detected by measuring the bias voltage, which further enables an abnormality in a floating gate, incorporated in another chip contained in the same wafer as contains an inferior chip, to be anticipated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a block diagram showing a monitor circuit according to a second embodiment, of the present invention which is placed on a semiconductor chip;

FIG. 4 is a circuit diagram showing the monitor circuit of FIG. 3;

FIG. 5 is a circuit diagram showing a semiconductor memory device incorporating the monitor circuit of FIG. 1; and FIG. 6 is a circuit diagram showing part of a monitor circuit according to a third embodiment of the present invention.

DETAILED DESCRIPTION OF THE PREFERRED EMBODIMENTS

This invention will be explained in detail with reference to the accompanying drawings showing embodiments thereof.

Figure 1:
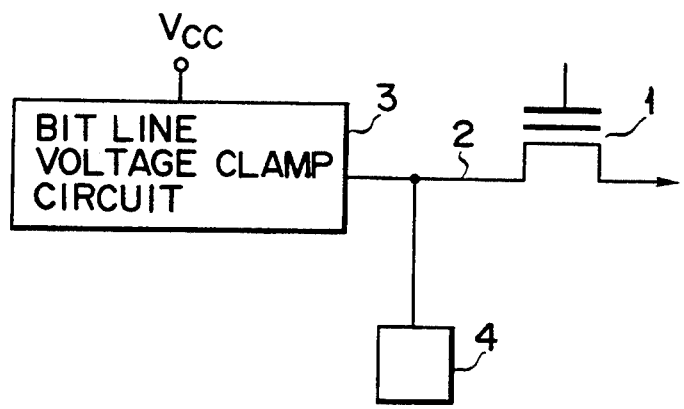
FIG. 1 is a block diagram showing a monitor circuit, to be incorporated in a semiconductor memory device, according to a first embodiment of the invention.
Figure 2:
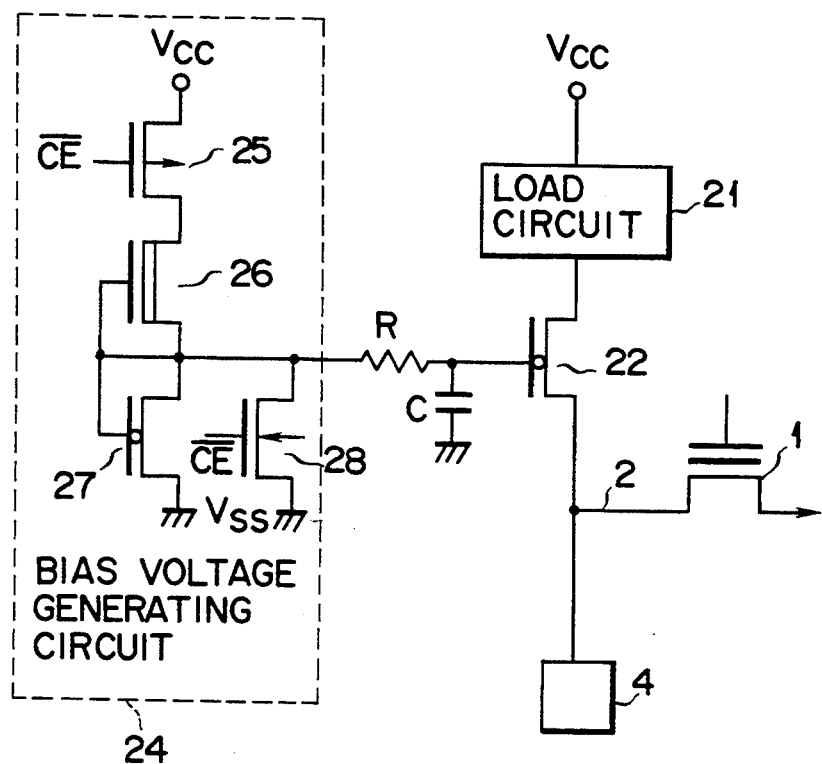
FIG. 2 is a circuit diagram showing the monitor circuit of FIG. 1 in more detail.

FIG. 1 shows a first embodiment of the invention, i.e., a memory cell 1 consisting of a floating gate type FET formed on an EPROM chip, a bit line 2 connected to the drain of the FET 1, a bit line voltage clamp circuit 3 connected between the bit line 2 and a vcc power source, and a monitor pad 4 serving as monitor means for monitoring the voltage of the drain voltage of the FET 1. The monitor pad 4 is connected to the junction between the clamp circuit 3 and bit line 2. In general, a column-selecting transistor (not shown) is connected between the cell transistor 1 and clamp circuit 3.

various kinds of bit line voltage clamp circuits are known, one of which is shown in FIG. 2. A load circuit 21 and an I-type N-channel transistor 22 having a gate threshold voltage of about 0 are connected in series between the Vcc power source and bit line 2. The transistor 22 has a gate supplied with a bias voltage from a bias voltage generating circuit 24 via a voltage stabilizing circuit consisting of a resistor R and a capacitor C. A monitor pad 4 is connected to the junction between the transistor 22 and bit line 2. The bias voltage generating circuit 24 has a series circuit connected between a vcc power source terminal and a vss power source (ground voltage). This series circuit comprises an enhancement-type P-channel transistor 25 having its gate controlled such that it is turned on and off in response to an active state and an inactive state of a chip enabling signal $\overline{CE}$, respectively, a depletion-type N-channel transistor 26 having its gate and source connected to each other, and an I-type N-channel transistor 27 having its drain and gate connected to each other. Further, an enhancement-type N-channel transistor 28, having its gate controlled such that it is turned on and off in response to the active state and inactive state of the chip enabling signal $\overline{CE}$, respectively, is connected between the vss power source and the Junction (bias voltage output terminal) of the drains of the transistors 26 and 27.

In the EPROM incorporated in the embodiment, if the bias voltage generating circuit 24 and I-type transistor 22 for voltage clamping are in a normal condition, the bias output voltage of the circuit 24 is approx. 1.1 V, while the voltage (drain voltage of the cell transistor to be monitored) at the junction between the I-type transistor 22 and bit line 2 is also approx. 1.1 V. An abnormality, if one exists, of a bit line voltage clamp circuit can be detected by a test effected in the production stage, i.e., by monitoring the drain voltage of the memory cell transistor, applied at the time of reading data therefrom, by means of the monitor pad 4. Thus, inferior products can be removed, thereby enhancing the reliability of the final products.

The pad 4 may serve as a combination pad of a monitor pad and another pad (e.g. Input or Output Pad). In this case, the logical sum of the drain voltage of the cell transistor and the voltage of another circuit may be applied to the pad 4.

Further, though the drain voltage of the cell transistor is directly applied to the monitor pad 4 in the embodiment, thereby performing direct monitoring, this may be modified such that the result obtained by comparing the drain voltage of the cell transistor with a reference voltage by means of an analog voltage comparison circuit (e.g. a bit line voltage detecting circuit for reading out data from the cell transistor) incorporated in the EPROM is applied to the pad 4, thus performing indirect monitoring.

FIG. 3 shows a second embodiment of the invention formed on a non-volatile semiconductor memory (e.g. EPROM) chip area 30. Specifically, the chip area 30 is provided with a floating-type memory cell transistor 1, a bit line voltage clamp circuit 3 for clamping the drain voltage of the cell transistor 1 at a low value, ordinary bonding pads 5, and monitor means for monitoring the drain voltage of the cell transistor 1. The monitor means comprises a monitor circuit 31, formed on that portion of the chip area 30 which is other than that on which the memory cell array of the cell transistor 1 is formed (alternatively, the circuit 31 may be formed on a scribe line of the wafer), and a monitor pad 4 connected to the bit line junction of the circuit 31. The circuit 31 operates irrespective of the transistor 1 and clamp circuit 3.

The monitor circuit 31 has a structure similar to the bias voltage generating circuit shown in FIG. 2, or alternatively has a structure as shown in FIG. 4, which is the same as the former except that a transistor for chip enable control is not incorporated. More specifically, the monitor circuit shown in FIG. 4 is a series circuit comprising a depletion-type N-channel transistor 32 having its gate and source connected to each other, and an I-type N-channel transistor 33 having its drain and gate connected to each other.

Also in the EPROM according to the second embodiment, the drain voltage of the memory cell transistor 1, applied at the time of reading data therefrom, can be monitored by the monitor circuit 31 and monitor pad 4, so that an abnormality, if one exists, of a bit line voltage clamp circuit can be detected by a test effected in the production stage, and hence inferior products can be removed, thereby enhancing the reliability of the products.

The monitor circuit 31 may have a structure more simple than the above only if the characteristics of the bit line voltage clamp circuit 3 are sufficiently reflected therein. For example, a transistor similar to the depletion-type transistor 26 or I-type N-channel transistor 27 incorporated in the bias voltage generating circuit 24 shown in FIG. 2 may be provided, and its characteristics may be monitored.

FIG. 5 shows a semiconductor memory device incorporating the monitor circuit shown in FIG. 1, while FIG. 6 shows a monitor circuit according to another embodiment of the invention.

In the device of FIG. 5, the pad 4 for supplying a bias voltage monitoring signal M is provided separate from and aligned with pads 5-1 and 5-2 for supplying normal memory data signals S1 and S2, respectively.

In the device of FIG. 6, a pad 105-1 supplies the monitor signal M and normal data signal S1, respectively, under the control of control signals S and $\bar{S}$ from inverters 41 and 42. This pad is used as a pad for supplying the bias voltage monitoring signal M, for testing the bias voltage.

As is described above, in the non-volatile semiconductor memory device of the invention, the drain voltage of the non-volatile memory cell transistor can be monitored in direct and indirect manners. Thus, an abnormality, if one exists, in a bit line voltage clamp circuit can be detected by a test effected in the production stage, which enables inferior products to be removed, and hence enhances the reliability of the products.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a power supply terminal;
   a circuit ground;
   a plurality of memory cells for storing data;
   means connected between the power supply terminal and the circuit ground and having a depletion-type FET and an intrinsic-type FET for generating a bias voltage to be applied to the memory cells; and
   connecting/applying means for connecting the generating means to an external measuring device and for applying the bias voltage to the external measuring device.

2. A semiconductor memory device comprising to claim 1, wherein said connecting/applying means includes a metal pad.

3. A semiconductor memory device according to claim 1, wherein the memory cells include floating gate FETs.

4. A semiconductor memory device according to claim 1, further comprising a load circuit and a switching transistor which are arranged between the bias voltage generating means and the plurality of memory cells.

5. A semiconductor memory device according to claim 1, further comprising:
   means for selecting one signal from a plurality of signals to supply to the monitor means.

6. A semiconductor memory device comprising:
   a power supply terminal;
   a circuit ground;
   a plurality of memory cells for storing data;
   means, connected between the power supply terminal and the circuit ground, including a switching transistor, a depletion-type FET, and an intrinsic-type FET for generating a bias voltage to be applied to the memory cells; and
   connecting/applying means for connecting the bias voltage generating means to an external measuring device and for applying the bias voltage to the external measuring device.

7. A semiconductor memory device comprising:

a power supply terminal;
a circuit ground;
a plurality of memory cells for storing data;
means connected between the power supply terminal and the circuit ground for generating a bias voltage to be applied to the memory cells;
connecting/applying means for connecting the generating means to an external measuring device and for applying the bias voltage to the external measuring device; and
a resistor and capacitor which are arranged between the bias voltage generating means and a monitor means.

8. A semiconductor memory device formed on a semiconductor chip, comprising:
a power supply terminal formed on the chip;
a circuit ground formed on the chip;
a plurality of memory cells formed on the chip, for storing data;
a depletion-type FET having two ends, a first end being connected to the power supply terminal;
an intrinsic-type FET having two ends, a first end being connected to a second end of the depletion-type FET, and a second end being connected to the circuit ground; and monitor means, connected to the second end of the depletion-type FET, for measuring the drain potential of at least one of the plurality of memory cells.

9. A semiconductor memory device according to claim 8, wherein the monitor means includes a metal pad.

10. A semiconductor memory device according to claim 8, wherein the plurality of memory cells include floating gate FETs.

* * * * *